(12) United States Patent  (10) Patent No.: US 9,000,795 B2
Chang et al.  (45) Date of Patent: Apr. 7, 2015

(54) ELECTRICAL COLLECTING COVER FOR COVERING AN ELECTROSTATIC GUN AND ELECTROSTATIC TESTING DEVICE THEREWITH

(75) Inventors: Chiu-Hsien Chang, New Taipei (TW); Lung-Fai Tuen, New Taipei (TW); Wei-Cheng Lin, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 854 days.

(21) Appl. No.: 13/253,077

(22) Filed: Oct. 5, 2011

(65) Prior Publication Data

US 2012/0320557 A1    Dec. 20, 2012

(30) Foreign Application Priority Data

Jun. 15, 2011    (TW) .............................. 100120909 A

(51) Int. Cl.
  *H01T 23/00*  (2006.01)
  *G01R 29/12*  (2006.01)
  *G01R 31/00*  (2006.01)
  *G01R 31/14*  (2006.01)

(52) U.S. Cl.
  CPC .............. *G01R 29/12* (2013.01); *G01R 31/001* (2013.01); *G01R 31/14* (2013.01)

(58) Field of Classification Search
  CPC .................. G01R 1/07342; G01R 1/06711
  USPC .................................................. 361/818, 816
  See application file for complete search history.

(56) References Cited

U.S. PATENT DOCUMENTS

| 5,430,604 | A | * | 7/1995 | Wong ............................ 361/230 |
| 5,539,598 | A | * | 7/1996 | Denison et al. ................ 360/323 |
| 5,912,559 | A | | 6/1999 | Bortolini |
| 6,595,801 | B1 | * | 7/2003 | Leonard et al. .......... 439/607.55 |
| 2002/0011565 | A1 | * | 1/2002 | Drexel et al. .................. 250/310 |
| 2009/0111324 | A1 | * | 4/2009 | Hughes et al. ........... 439/607.02 |
| 2010/0027184 | A1 | * | 2/2010 | Chen ............................. 361/220 |
| 2010/0099282 | A1 | * | 4/2010 | Consoli et al. ................ 439/103 |

FOREIGN PATENT DOCUMENTS

| CN | 101213888 A | 7/2008 |
| TW | 286049 | 9/1996 |
| TW | M300810 | 11/2006 |

OTHER PUBLICATIONS

Office action mailed on Aug. 30, 2013 for the Taiwan application No. 100120909, filing date: Jun. 15, 2011, p. 1 line 11~14, p. 2~4 and p. 5 line 1~19 and line 23~26 and search report.
Office action mailed on Jul. 16, 2014 for the China application No. 201110174302.7, p. 3 line 3~12, line 14, line 16, line 19~24 and Fig. 2 and p. 4 line 1~9, line 11 and line 13~14 and Fig. 2.

* cited by examiner

*Primary Examiner* — Arleen M Vazquez
*Assistant Examiner* — Dominic Hawkins
(74) *Attorney, Agent, or Firm* — Winston Hsu; Scott Margo

(57) ABSTRACT

An electrical collecting cover for covering an electrostatic gun is disclosed. The electrical collecting cover includes a connecting portion for connecting with a main body of the electrostatic gun, a shielding portion connected to the connecting portion for shielding the main body of the electrostatic gun, a sleeve portion connected to the shielding portion for sheathing with a discharging head of the electrostatic gun, and an electrostatic discharge portion connected to the sleeve portion and located on a side of the discharging head for guiding static electricity from the discharging head of the electrostatic gun as the sleeve portion sheathes with the discharging head of the electrostatic gun.

16 Claims, 7 Drawing Sheets

ELECTRICAL COLLECTING COVER FOR COVERING AN ELECTROSTATIC GUN AND ELECTROSTATIC TESTING DEVICE THEREWITH

BACKGROUND OF THE INVENTION

1. Field of the Invention

The present invention relates to an electrical collecting cover for covering an electrostatic gun and an electrostatic testing device therewith, and more particularly, to an electrical collecting cover capable of precisely guiding static electricity to a test object and an electrostatic testing device therewith.

2. Description of the Prior Art

In certain relative dry area, it would be a big issue for an electronic device to prevent static electricity interference. For example, when a user operates a notebook computer in the certain relative dry area, the static electricity generated by the user's fingers might be guided into the notebook computer via certain positions whereon metal components, such as screws, are disposed. Thus, if mechanism of preventing static electricity for the notebook computer is not well-equipped, internal electrical components of the notebook computer might be damaged due to the static electricity. A conventional static electricity testing mechanism is to utilize an electrostatic gun for discharging the static electricity to a certain area of the electronic device, such as the notebook computer. However, when the electronic device has a plurality of conductive members disposed closely or with higher conductivity coefficients, the static electricity is easily guided to other conductive members when the electrostatic gun is discharging static electricity to one of the conductive members. As a result, it causes an operator to repeat testing process until the static electricity can be exactly guided to the right conductive member. Furthermore, air between the electrostatic gun and the test object accumulates static electricity due to repeated testing. In such a manner, it will affect accuracy of testing for the static electricity, resulting in that the static electricity can not be guided to the tested position, so as to damage the internal components of the electronic device.

SUMMARY OF THE INVENTION

Thus, the present invention provides an electrical collecting cover for covering an electrostatic gun and an electrostatic testing device therewith for solving above drawbacks.

According to the claimed invention, an electrical collecting cover for covering an electrostatic gun includes a connecting portion with a side connected to a main body of the electrostatic gun; a shielding portion with a side connected to another side of the connecting portion for shielding the main body of the electrostatic gun; a sleeve portion with a side connected to the shielding portion for sheathing with a discharging head of the electrostatic gun; and an electrostatic discharge portion connected to another side of the sleeve portion and located on a side of the discharging head far from the main body for guiding static electricity from the discharging head of the electrostatic gun as the sleeve portion sheathes with the discharging head of the electrostatic gun.

According to the claimed invention, the electrostatic discharge portion comprises an electrostatic guiding tube and a rotary cap connected to the electrostatic guiding tube in a rotatable manner.

According to the claimed invention, a first opening is formed on the electrostatic guiding tube, a second opening is formed on the rotary cap, and the electrostatic discharge portion discharges the static electricity from the discharging head of the electrostatic gun when the second opening on the rotary cap is rotated to a position corresponding to the first opening on the electrostatic guiding tube.

According to the claimed invention, a fixing structure is disposed inside the shielding portion for fixing the main body of the electrostatic gun.

According to the claimed invention, the fixing structure is a sucker structure or a hook structure.

According to the claimed invention, the electrical collecting cover further includes a sleeve for sheathing with a side of the electrostatic discharge portion far from the sleeve portion.

According to the claimed invention, a thread structure is formed on a surface of the electrostatic discharge portion for screwing the sleeve.

According to the claimed invention, an opening of the sleeve is a circular opening, a triangular opening or a rectangular opening.

According to the claimed invention, the sleeve portion is a retractable sleeve structure.

According to the claimed invention, the connecting portion, the shielding portion, the sleeve portion and the electrostatic discharge portion are made of non-conductive material and integrally formed.

According to the claimed invention, the electrostatic discharge portion is made of transparent material.

According to the claimed invention, an electrostatic testing device for testing static electricity includes an electrostatic gun comprising a main body and a discharging head connected to the main body for discharging the static electricity; and an electrical collecting cover for covering the electrostatic gun including a connecting portion with a side connected to the main body of the electrostatic gun; a shielding portion with a side connected to another side of the connecting portion for shielding the main body of the electrostatic gun; a sleeve portion with a side connected to the shielding portion for sheathing with the discharging head of the electrostatic gun; and an electrostatic discharge portion connected to another side of the sleeve portion and located on a side of the discharging head far from the main body for guiding the static electricity from the discharging head of the electrostatic gun as the sleeve portion sheathes with the discharging head of the electrostatic gun.

In summary, the present invention utilizes the electrical collecting cover covering the electrostatic gun to guide the static electricity discharged by the electrostatic gun to a test object, so as to prevent the static electricity from being guided to other conductive members. In other words, the static electricity discharged by the electrostatic gun can be guided to the test object correctly via discharging path of the electrical collecting cover. Accordingly, it can greatly enhance accuracy of testing by preventing the static electricity to be guided to the conductive members other than the test object, so as to prevent the electrical components other than the test object from damage.

These and other objectives of the present invention will no doubt become obvious to those of ordinary skill in the art after reading the following detailed description of the embodiment that is illustrated in the various figures and drawings.

DETAILED DESCRIPTION

Figure 1:
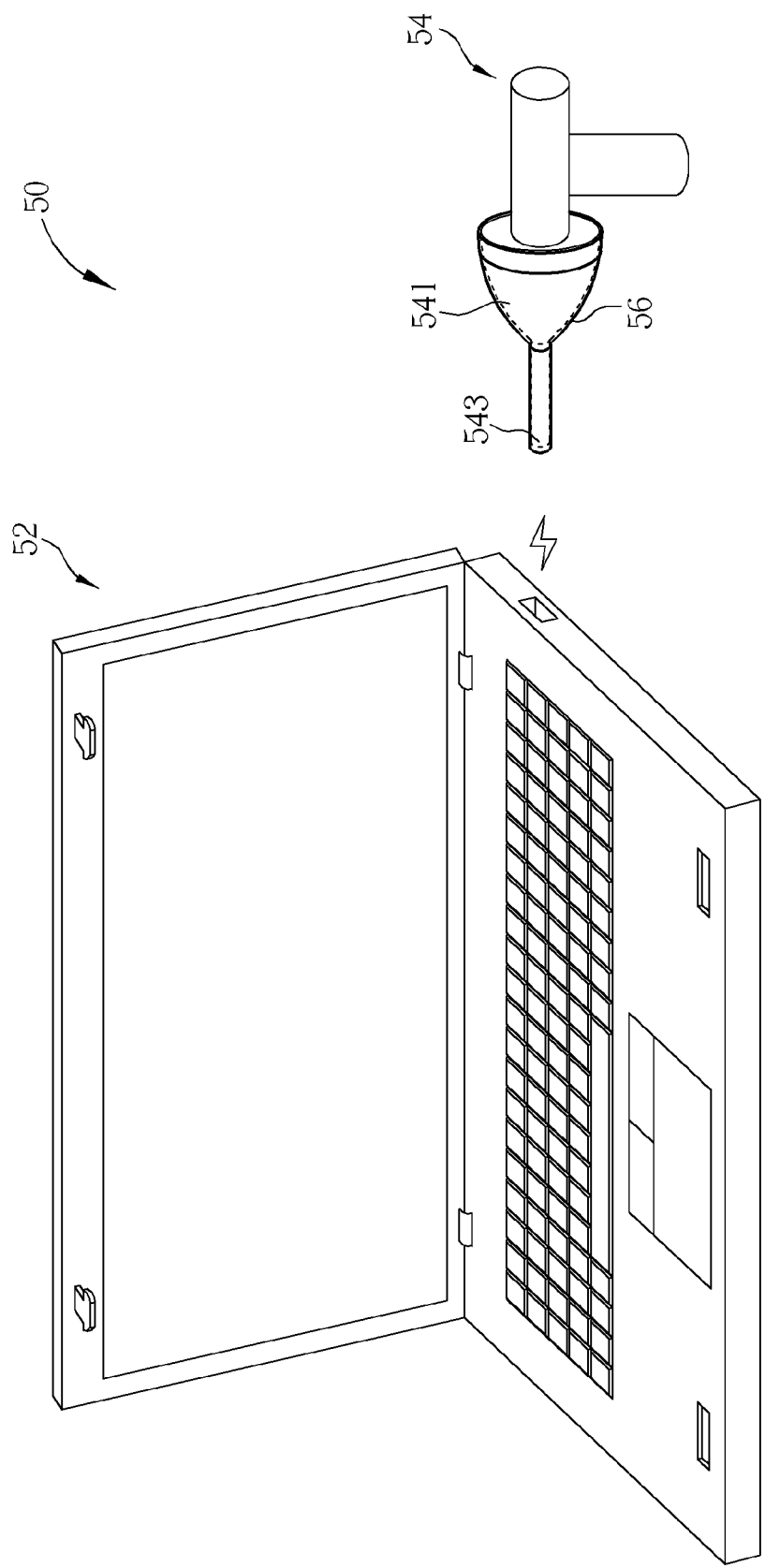
FIG. 1 is a diagram illustrating an electrostatic testing device capable of testing static electricity for an electronic device according to an embodiment of the present invention.

Please refer to FIG. 1. FIG. 1 is a diagram illustrating an electrostatic testing device 50 capable of testing static electricity for an electronic device 52 according to an embodiment of the present invention. The electrostatic testing device 50 is used for discharging the static electricity to a test area of the electronic device 52, such as a notebook computer, so as to execute static electricity testing. The electrostatic testing device 50 includes an electrostatic gun 54 including a main body 541 and a discharging head 543. The discharging head 543 is connected to the main body 541 for discharging the static electricity. The electrostatic testing device 50 further includes an electrical collecting cover 56 for covering the electrostatic gun 54, so as to guide the static electricity discharged by the electrostatic gun 54 to the test area of the electronic device 52. In this embodiment, the electrostatic gun 54 and the electrical collecting cover 56 can be two separate components or can be integrally formed. The electrical collecting cover 56 can be made of non-conductive material, such as acrylic material, epoxy material and so on for preventing the main body 541 and the discharging head 543 of the electrostatic gun 54 from damage due to collision. When the electrical collecting cover 56 is firmly combined with the electrostatic gun 54 for testing the static electricity for a test object, the static electricity discharged by the electrostatic gun 54 can be successfully guided to the test object by the electrical collecting cover 56 since the electrical collecting cover 56 can be made of the non-conductive material, which means the electrical collecting cover 56 has high resistance and a conductive coefficient of the electrical collecting cover 56 is smaller than a conductive coefficient of the test object. Furthermore, the static electricity can not be guided to other conductive members or other positions which is capable of guiding the static electricity. In other words, the static electricity discharged by the electrostatic gun 54 can be guided to the position of the test object via a discharging path of the electrical collecting cover 56. Furthermore, the electrical collecting cover 56 can be made of flexible material, such as plastic material, rubber material and so on. In such a manner, the electrostatic gun 54 can discharge the static electricity to the test object corresponding to the structure of the test object by the electrical collecting cover 56.

Figure 2:
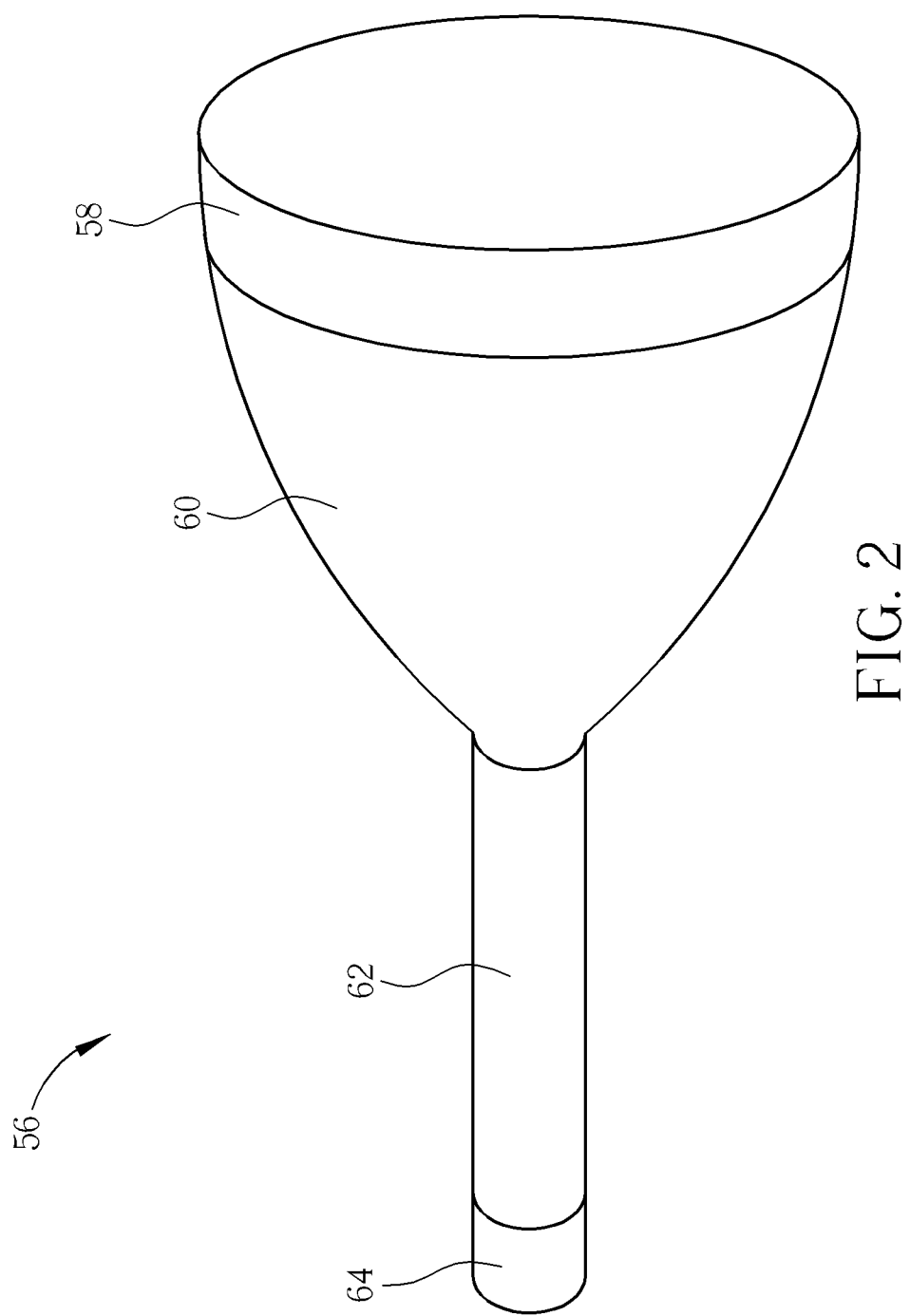
FIG. 2 is a diagram of an electrical collecting cover according to the embodiment of the present invention.
Figure 3:
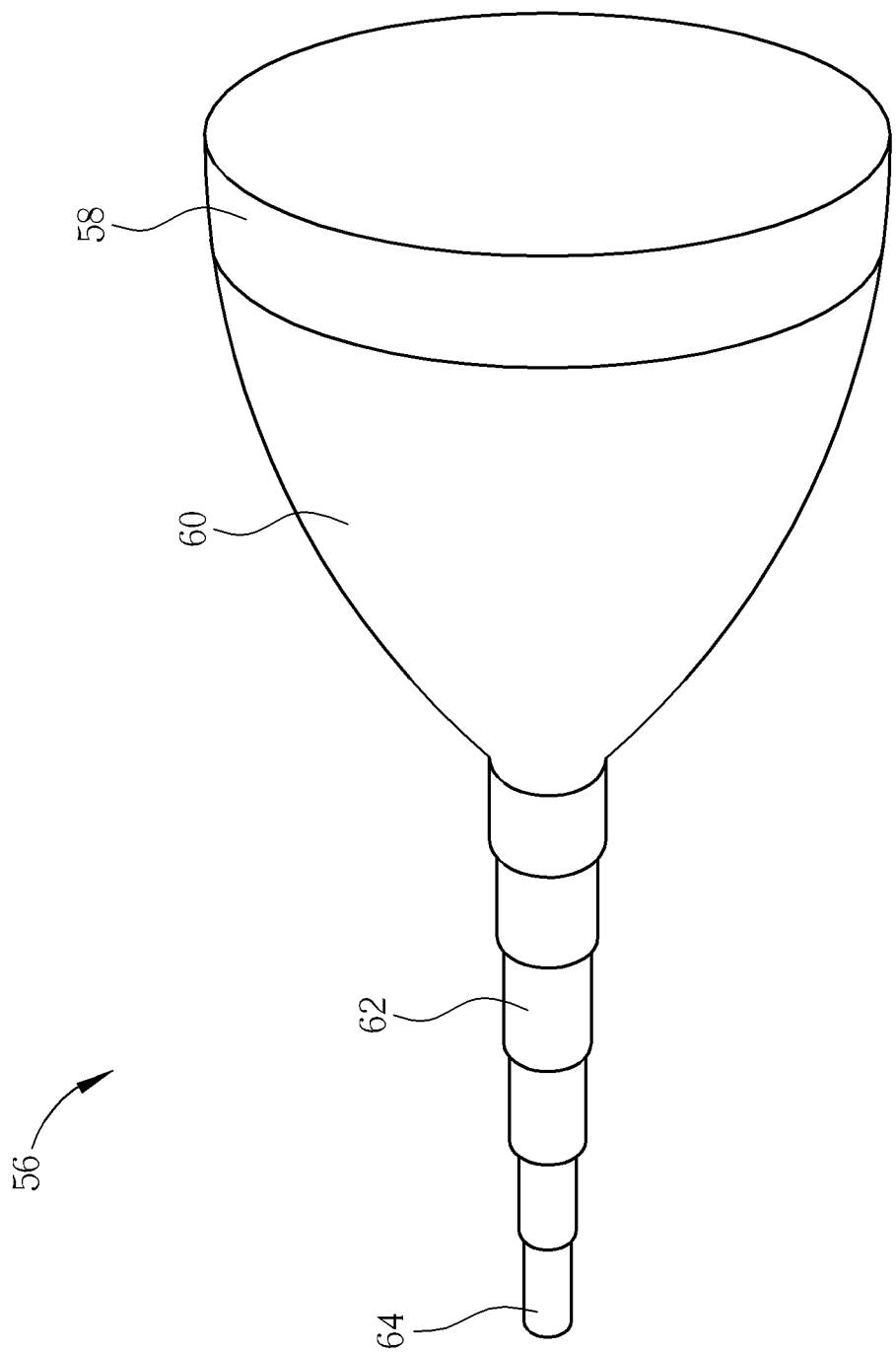
FIG. 3 is a diagram of the electrical collecting cover according to another embodiment of the present invention.

Please refer to FIG. 1 and FIG. 2. FIG. 2 is a diagram of the electrical collecting cover 56 according to the embodiment of the present invention. The electrical collecting cover 56 includes a connecting portion 58 with a side connected to the main body 541 of the electrostatic gun 54, so as to combine the electrical collecting cover 56 onto the electrostatic gun 54. In this embodiment, the connecting portion 58 of the electrical collecting cover 56 and the main body 541 of the electrostatic gun 54 can be integrally formed or separately independent components. The electrical collecting cover 56 further includes a shielding portion 60 with a side connected to another side of the connecting portion 58 for shielding the main body 541 of the electrostatic gun 54 for preventing the main body 541 of the electrostatic gun 54 from damage due to collision. The electrical collecting cover 56 further includes a sleeve portion 62 with a side connected to the shielding portion 60 for sheathing with the discharging head 543 of the electrostatic gun 54 for preventing the discharging head 543 of the electrostatic gun 54 from damage due to collision. Please refer to FIG. 3. FIG. 3 is a diagram of the electrical collecting cover 56 according to another embodiment of the present invention. The sleeve portion 62 can be a retractable sleeve structure. Accordingly, a length of the sleeve portion 62 is adjustable according to structure of the testing area, such as for discharging the static electricity deeply inside the test object. For example, the sleeve portion 62 can discharge the static electricity to a position where the electrostatic gun 54 is hard to reach, e.g. a USB plug or other components inside a plug. The electrical collecting cover 56 further includes an electrostatic discharge portion 64 connected to another side of the sleeve portion 62 and located on a side of the discharging head 543 far from the main body 541 for guiding static electricity from the discharging head 543 of the electrostatic gun 54 to the test object as the sleeve portion 62 sheathes with the discharging head 543 of the electrostatic gun 54. In this embodiment, the electrostatic discharge portion 64 can be made of transparent material. In such a manner, an operator who performs the static electricity test can observe situation of discharging the static electricity through the electrostatic discharge portion 64. Furthermore, the connecting portion 58 of the electrical collecting cover 56, the shielding portion 60, the sleeve portion 62 and the electrostatic discharge portion 64 can be made of non-conductive material and can be integrally formed.

Figure 4:
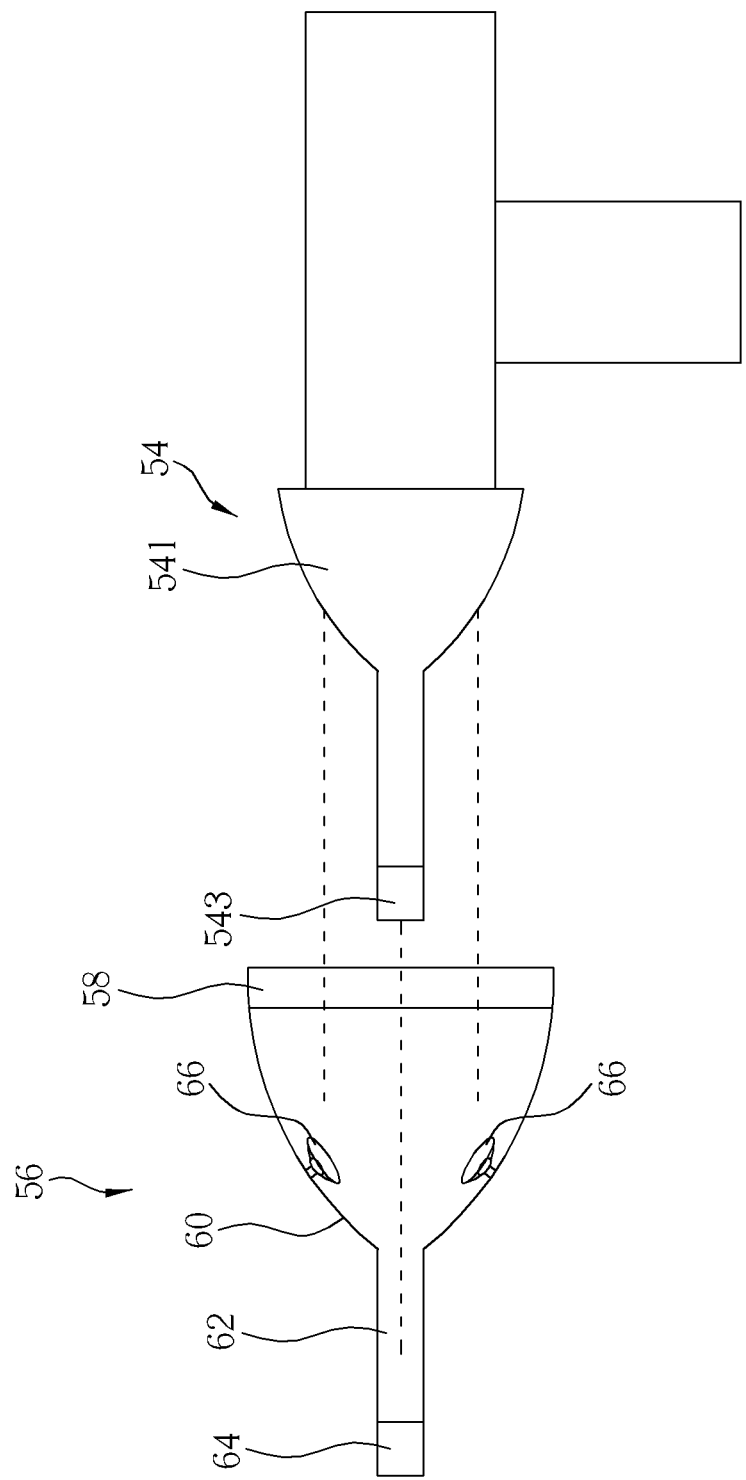
FIG. 4 and FIG. 5 are respectively diagrams illustrating a fixing structure of the electrical collecting cover combines with a main body of an electrostatic gun according to different embodiments of the present invention.
Figure 5:
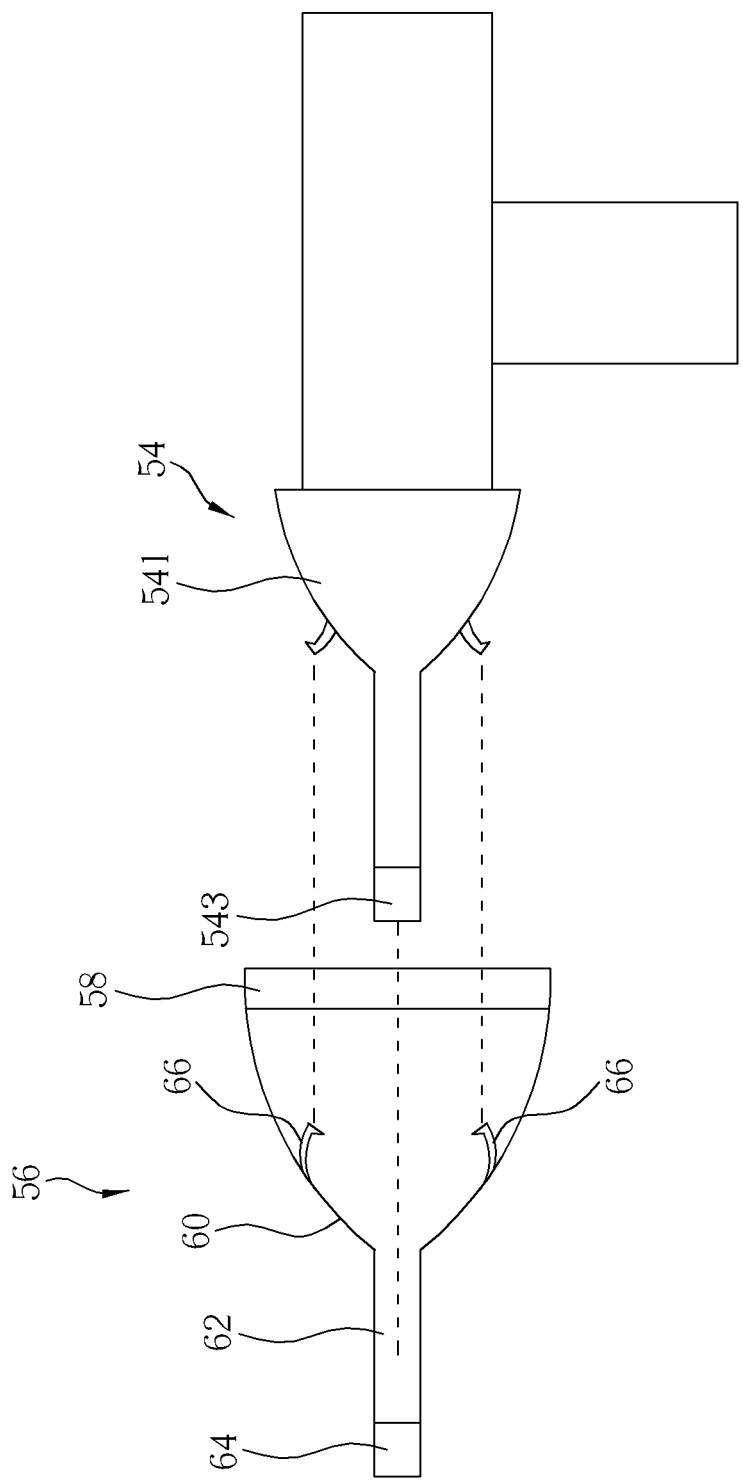

Furthermore, in order to firmly combine the electrical collecting cover 56 and the electrostatic gun 54, a fixing structure 66 can be disposed inside the shielding portion 60 for fixing the main body 541 of the electrostatic gun 54. Please refer to FIG. 4 and FIG. 5. FIG. 4 and FIG. 5 are respectively diagrams illustrating the fixing structure 66 of the electrical collecting cover 56 combines with the main body 541 of the electrostatic gun 54 according to different embodiments of the present invention. As shown in FIG. 4, the fixing structure 66 can be a sucker structure for sucking the main body 541 of the electrostatic gun 54, so as to fix the electrical collecting cover 56 onto the electrostatic gun 54 without separation. As shown in FIG. 5, the fixing structure 66 can be a hook structure, and a corresponding hook structure or a corresponding slot can be formed on the main body 541 of the electrostatic gun 54 for engaging with the hook structure of the shielding portion 60. In such a manner, the electrical collecting cover 56 and the electrostatic gun 54 can be firmly fixed. The fixing structure for fixing the electrical collecting cover 56 and the electrostatic gun 54 is not limited to those mentioned above, and it depends on practical demands.

Figure 6:
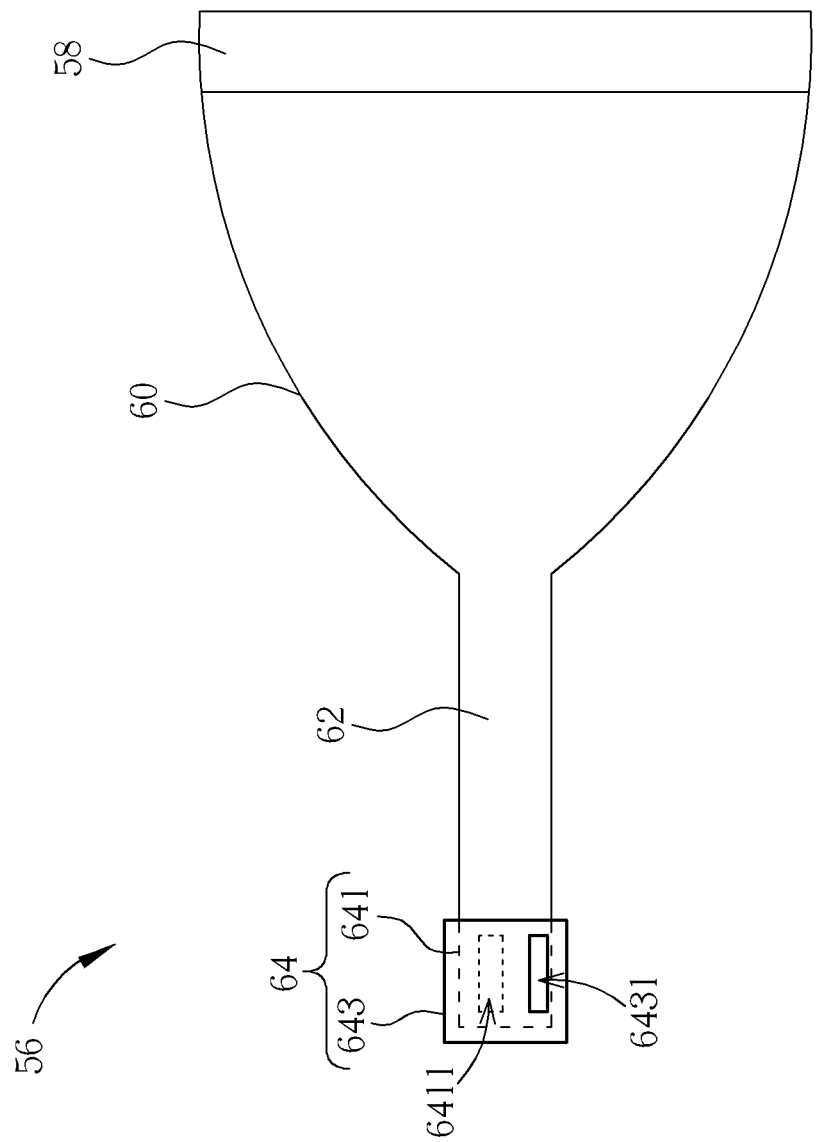
FIG. 6 is a diagram of the electrical collecting cover according to another embodiment of the present invention.

Please refer to FIG. 6. FIG. 6 is a diagram of the electrical collecting cover 56 according to another embodiment of the present invention. The electrostatic discharge portion 64 of the electrical collecting cover 56 can include an electrostatic guiding tube 641 and a rotary cap 643. The rotary cap 643 is connected to the electrostatic guiding tube 641 in a rotatable manner. Furthermore, a first opening 6411 is formed on the electrostatic guiding tube 641, and a second opening 6431 is formed on the rotary cap 643. Since the rotary cap 643 can rotate relative to the electrostatic guiding tube 641, the relative position between the second opening 6431 and the first opening 6411 can be adjusted by rotating the rotary cap 643 relative to the electrostatic guiding tube 641. For example, it can control quantity of the static electricity discharged from the discharging head 543 of the electrostatic gun 54 by adjusting the relative position between the second opening 6431 and the first opening 6411. In other words, the second opening 6431 overlaps with the first opening 6411 more, and the more quantity of the static electricity can be discharged from the discharging head 543 accordingly. When the electrical collecting cover 56 of the present invention is applied with the electrostatic gun 54, first the second opening 6431 of the rotary cap 643 can be rotated to a position corresponding to a position of the first opening 6411 of the electrostatic guiding tube 641, so as to form a discharging path. In the meanwhile, the electrostatic gun 54 generates static electricity by the discharging head 543, and the static electricity passes through the shielding portion 60 and the sleeve portion 62 in sequence, and then the static electricity is guided to the electrostatic discharge portion 64. Then, the static electricity can be guided to the testing area via the second opening 6431 on the rotary cap 643 and the first opening 6411 on the electrostatic guiding tube 641, so as to guide the static electricity to the test object precisely. The mechanism for controlling the quantity of the static electricity discharged from the electrostatic discharge portion 64 is not limited to those mentioned above, and it depends on practical demands.

Figure 7:
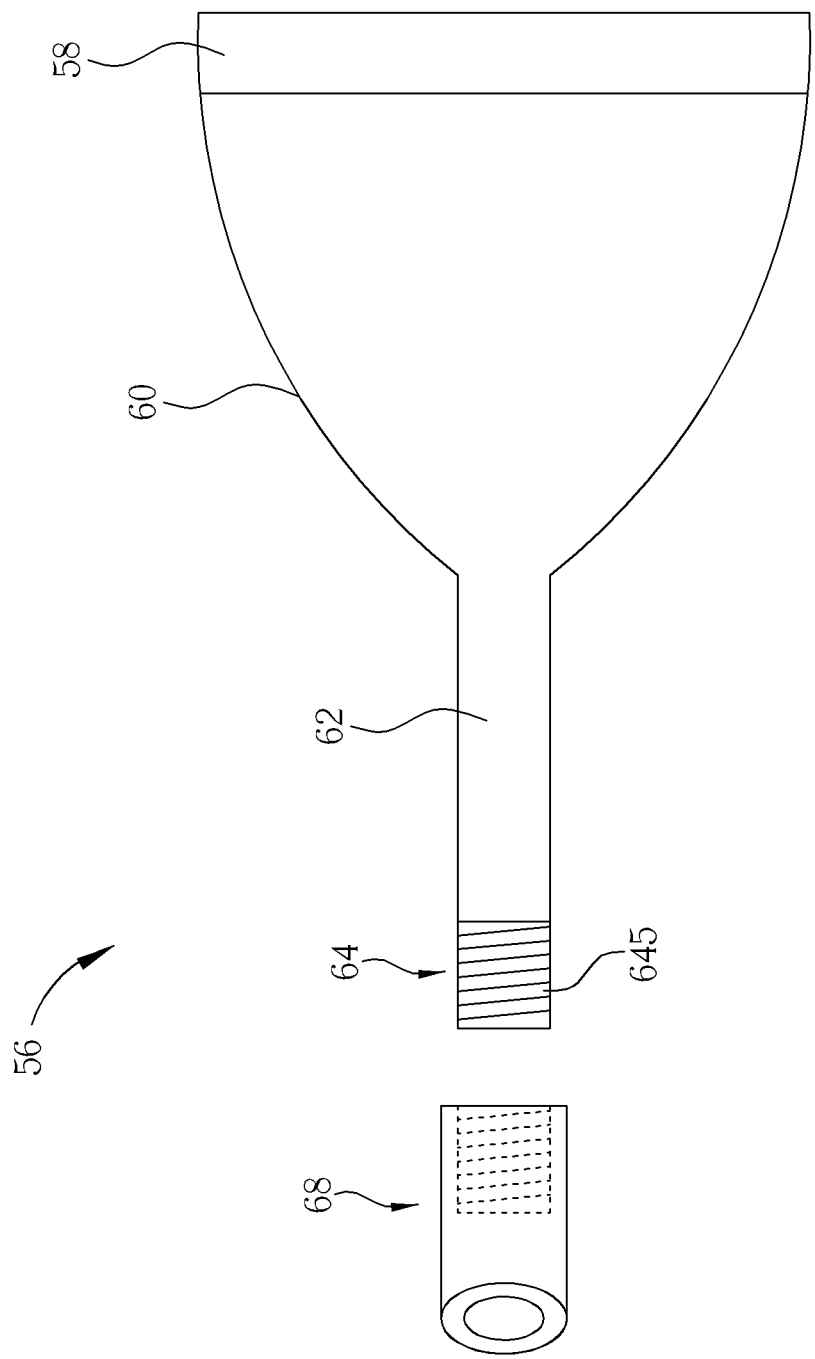
FIG. 7 is a diagram of the electrical collecting cover according to another embodiment of the present invention.

Please refer to FIG. 7. FIG. 7 is a diagram of the electrical collecting cover 56 according to another embodiment of the present invention. In order to fit structures of the testing area more appropriately, the electrostatic testing device 50 can further include a sleeve 68 for sheathing with a side of the electrostatic discharge portion 64 far from the sleeve portion 62, and a thread structure 645 is formed on a surface of the electrostatic discharge portion 64 for screwing the sleeve 68. For example, the thread structure 645 can be formed on an inner side or on an outer side of the electrostatic discharge portion 64, such that the sleeve 68 can be screwed in or out along the thread structure 645. Since the sleeve 68 can be fixed on or released from the electrostatic discharge portion 64 by screwing in a clockwise direction or in a counterclockwise direction correspondingly, the sleeve 68 can be switched corresponding to each structure of the testing area, for example, an opening of the sleeve 68 can be a circular opening, a triangular opening, a rectangular opening and so on. In other words, the opening of the sleeve 68 can be designed according to the opening of the discharging path of the testing area, such that the electrostatic gun 54 can be utilized for discharging different testing areas or different test objects by equipping the corresponding electrical collecting cover 56.

It is easily to be achieved that the sleeve 68 and the electrostatic discharge portion 64 can be integrally formed. When the sleeve portion 62 of the above-mentioned electrical collecting cover 56 guides the static electricity, quantity of the discharged static electricity can be adjusted by the rotary cap 643 and the electrostatic guiding tube 641. Furthermore, the sleeve 68 with different openings allows the static electricity to be discharged corresponding to test objects within the testing area, and the sleeve portion 62 can be retractable, such that the sleeve portion 62 can reach deeply inside the different electronic devices 52 for executing the static electricity test. The above-mentioned structures applied with the electrostatic gun 54 and the electronic device 52 can control the quantity of the static electricity, a discharging direction, and a discharging depth can discharge the static electricity accurately.

Compared with the prior art, the present invention utilizes the electrical collecting cover covering the electrostatic gun to guide the static electricity discharged by the electrostatic gun to the test object, so as to prevent the static electricity from being guided to other conductive members. In other words, the static electricity discharged by the electrostatic gun can be guided to the test object correctly via discharging path of the electrical collecting cover. Accordingly, it can greatly enhance accuracy of testing by preventing the static electricity to be guided to the conductive members other than the test object, so as to prevent the electrical components other than the test object from damage.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electrical collecting cover for covering an electrostatic gun, comprising:
a connecting portion with a side connected to a main body of the electrostatic gun;
a shielding portion with a side connected to another side of the connecting portion for shielding the main body of the electrostatic gun;
a sleeve portion with a side connected to the shielding portion for sheathing with a discharging head of the electrostatic gun; and
an electrostatic discharge portion connected to another side of the sleeve portion and located on a side of the discharging head far from the main body for guiding static electricity from the discharging head of the electrostatic gun as the sleeve portion sheathes with the discharging head of the electrostatic gun, the electrostatic discharge portion comprising an electrostatic guiding tube and a rotary cap connected to the electrostatic guiding tube in a rotatable manner, a first opening being formed on the electrostatic guiding tube, a second opening being formed on the rotary cap, and the electrostatic discharge portion discharging the static electricity from the discharging head of the electrostatic gun when the second opening on the rotary cap is rotated to a position corresponding to the first opening on the electrostatic guiding tube.

2. The electrical collecting cover of claim 1, wherein a fixing structure is disposed inside the shielding portion for fixing the main body of the electrostatic gun.

3. The electrical collecting cover of claim 2, wherein the fixing structure is a sucker structure or a hook structure.

4. The electrical collecting cover of claim 1, further comprising a sleeve for sheathing with a side of the electrostatic discharge portion far from the sleeve portion.

5. The electrical collecting cover of claim 4, wherein a thread structure is formed on a surface of the electrostatic discharge portion for screwing the sleeve.

6. The electrical collecting cover of claim 4, wherein an opening of the sleeve is a circular opening, a triangular opening or a rectangular opening.

7. The electrical collecting cover of claim 1, wherein the sleeve portion is a retractable sleeve structure.

8. The electrical collecting cover of claim 1, wherein the connecting portion, the shielding portion, the sleeve portion and the electrostatic discharge portion are made of non-conductive material and integrally formed.

9. The electrical collecting cover of claim 1, wherein the electrostatic discharge portion is made of transparent material.

10. An electrostatic testing device for testing static electricity, comprising:
an electrostatic gun comprising a main body and a discharging head connected to the main body for discharging the static electricity; and an electrical collecting cover for covering the electrostatic gun, comprising:
- a connecting portion with a side connected to the main body of the electrostatic gun;
- a shielding portion with a side connected to another side of the connecting portion for shielding the main body of the electrostatic gun;
- a sleeve portion with a side connected to the shielding portion for sheathing with the discharging head of the electrostatic gun; and
- an electrostatic discharge portion connected to another side of the sleeve portion and located on a side of the discharging head far from the main body for guiding the static electricity from the discharging head of the electrostatic gun as the sleeve portion sheathes with the discharging head of the electrostatic gun, the electrostatic discharge portion comprising an electrostatic guiding tube and a rotary cap connected to the electrostatic guiding tube in a rotatable manner, a first opening being formed on the electrostatic guiding tube, a second opening being formed on the rotary cap, and the electrostatic discharge portion discharging the static electricity from the discharging head of the electrostatic gun when the second opening on the rotary cap is rotated to a position corresponding to the first opening on the electrostatic guiding tube.

11. The electrostatic testing device 10, wherein a fixing structure is disposed inside the shielding portion for fixing the main body of the electrostatic gun.

12. The electrostatic testing device of claim 10, further comprising a sleeve for sheathing with a side of the electrostatic discharge portion far from the sleeve portion.

13. The electrostatic testing device of claim 12, wherein a thread structure is formed on a surface of the electrostatic discharge portion for screwing the sleeve.

14. The electrostatic testing device of claim 10, wherein the sleeve portion is a retractable sleeve structure.

15. The electrostatic testing device of claim 10, wherein the connecting portion, the shielding portion, the sleeve portion and the electrostatic discharge portion are made of non-conductive material and integrally formed.

16. The electrostatic testing device of claim 10, wherein the connecting portion of the electrical collecting cover is integrally formed with the main body of the electrostatic gun.

* * * * *